(12) United States Patent
Bateman et al.

(10) Patent No.: US 9,837,149 B2
(45) Date of Patent: *Dec. 5, 2017

(54) LOW READ CURRENT ARCHITECTURE FOR MEMORY

(71) Applicant: UNITY SEMICONDUCTOR CORPORATION, Sunnyvale, CA (US)

(72) Inventors: Bruce Lynn Bateman, Fremont, CA (US); Christophe Chevallier, Palo Alto, CA (US); Darrell Rinerson, Cupertino, CA (US); Chang Hua Siau, Saratoga, CA (US)

(73) Assignee: Unity Semiconductor Corporation, Suynnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/181,009

(22) Filed: Jun. 13, 2016

(65) Prior Publication Data

US 2016/0372189 A1  Dec. 22, 2016

Related U.S. Application Data

(63) Continuation of application No. 14/254,209, filed on Apr. 16, 2014, now Pat. No. 9,368,200, which is a
(Continued)

(51) Int. Cl.
*G11C 17/00* (2006.01)
*G11C 13/00* (2006.01)
(Continued)

(52) U.S. Cl.
CPC .............. *G11C 13/004* (2013.01); *G11C 7/12* (2013.01); *G11C 7/22* (2013.01); *G11C 13/0002* (2013.01); *G11C 13/0004* (2013.01); *G11C 13/0007* (2013.01); *G11C 13/0009* (2013.01); *G11C 13/0011* (2013.01); *G11C 13/0026* (2013.01); *G11C 13/0028* (2013.01); *G11C 13/0061* (2013.01); *G11C 13/0069* (2013.01); *G11C 2013/0045* (2013.01); *G11C 2013/0054* (2013.01); *G11C 2213/11* (2013.01); *G11C 2213/31* (2013.01); *G11C 2213/32* (2013.01); *G11C 2213/53* (2013.01); *G11C 2213/71* (2013.01); *G11C 2213/77* (2013.01)

(58) Field of Classification Search
CPC .............. G11C 13/004; G11C 13/0002; G11C 11/5678; G11C 2213/71; G11C 11/1673; G11C 2013/0045; G11C 2013/009; G11C 13/0009; G11C 2213/70; H01L 27/101
USPC ....... 365/203, 46, 55, 74, 97, 100, 131, 148, 365/158, 171, 173, 163
See application file for complete search history.

(56) References Cited

U.S. PATENT DOCUMENTS

| 3,193,806 A | 7/1965 | Pohm et al. | |
|---|---|---|---|
| 6,097,638 A * | 8/2000 | Himeno | G11C 16/26 365/185.21 |

(Continued)

FOREIGN PATENT DOCUMENTS

WO    97/48032 A3    12/1997

*Primary Examiner* — Fernando Hidalgo
(74) *Attorney, Agent, or Firm* — Lowenstein Sandler LLP

(57) ABSTRACT

A low read current architecture for memory. Bit lines of a cross point memory array are allowed to be charged by a selected word line until a minimum voltage differential between a memory state and a reference level is assured.

21 Claims, 9 Drawing Sheets

Related U.S. Application Data continuation of application No. 13/252,934, filed on Oct. 4, 2011, now Pat. No. 8,737,151, which is a continuation of application No. 12/799,168, filed on Apr. 19, 2010, now Pat. No. 8,031,545, which is a continuation of application No. 11/881,500, filed on Jul. 26, 2007, now Pat. No. 7,701,791.

(51) Int. Cl.
 *G11C 7/12* (2006.01)
 *G11C 7/22* (2006.01)

(56) References Cited

U.S. PATENT DOCUMENTS

| | | | |
|---|---|---|---|
| 6,259,644 B1 | 7/2001 | Tran et al. | |
| 6,839,269 B2 | 1/2005 | Iwata et al. | |
| 6,917,539 B2 | 7/2005 | Rinerson et al. | |
| 6,992,922 B2 | 1/2006 | Rinerson | |
| 7,075,817 B2 | 7/2006 | Rinerson et al. | |
| 7,372,753 B1 | 5/2008 | Rinerson et al. | |
| 7,379,364 B2 | 5/2008 | Siau et al. | |
| 7,391,644 B2* | 6/2008 | Cho | G11C 8/10 365/163 |
| 7,436,723 B2 | 10/2008 | Rinerson et al. | |
| 7,538,338 B2 | 5/2009 | Rinerson et al. | |
| 7,701,791 B2 | 4/2010 | Rinerson et al. | |
| 2002/0027803 A1 | 3/2002 | Matsui | |
| 2006/0010301 A1 | 1/2006 | Yagawa | |
| 2006/0018149 A1* | 1/2006 | Rinerson | G11C 11/16 365/158 |
| 2006/0023497 A1 | 2/2006 | Kawazoe et al. | |
| 2006/0171200 A1 | 8/2006 | Rinerson et al. | |
| 2007/0091667 A1 | 4/2007 | Rohr et al. | |
| 2007/0159869 A1 | 7/2007 | Baek et al. | |
| 2008/0001176 A1 | 1/2008 | Gopalakrishnan et al. | |
| 2008/0144357 A1 | 6/2008 | Siau et al. | |
| 2008/0157126 A1 | 7/2008 | Bertin et al. | |
| 2009/0027976 A1 | 1/2009 | Rinerson et al. | |

\* cited by examiner

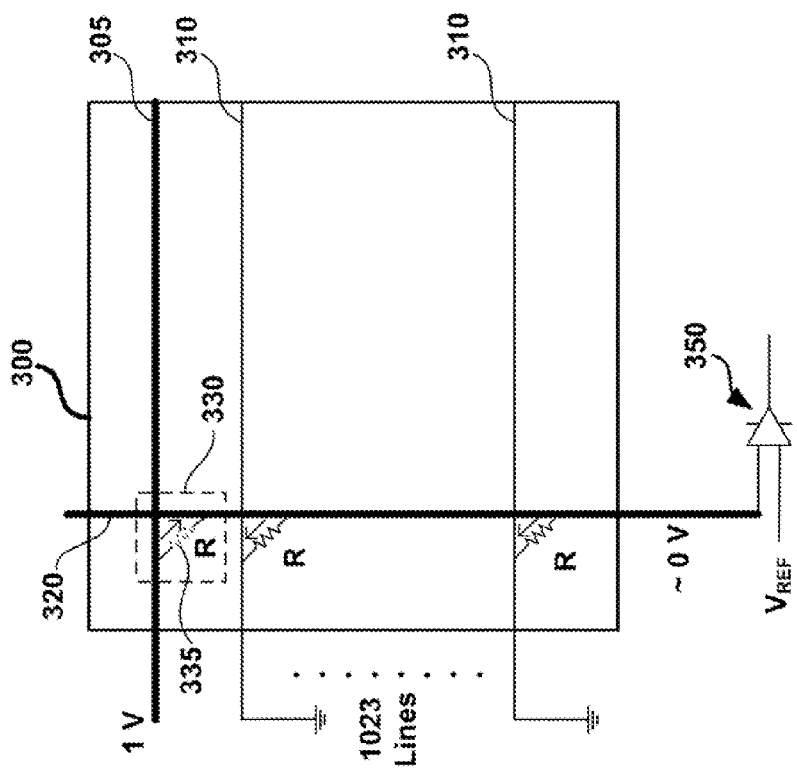
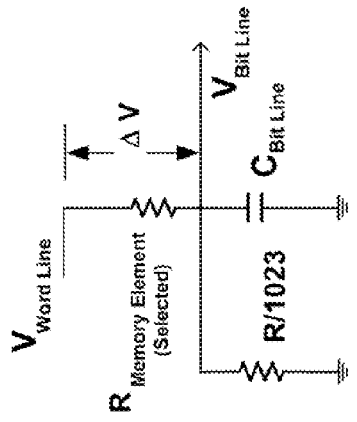
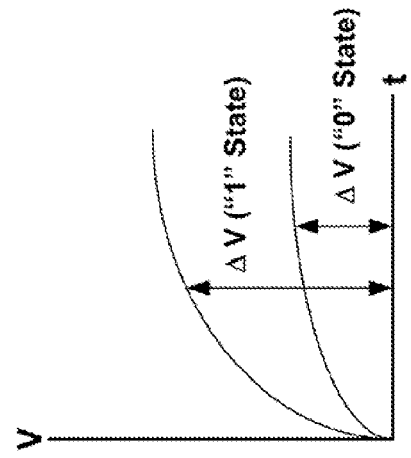
FIG. 3A
FIG. 3B
FIG. 3C

LOW READ CURRENT ARCHITECTURE FOR MEMORY

CROSS-REFERENCE TO RELATED APPLICATIONS

This application is a continuation of U.S. patent application Ser. No. 14/254,209, filed Apr. 16, 2014, which is a continuation of U.S. patent application Ser. No. 13/252,934, filed Oct. 4, 2011 (U.S. Pat. No. 8,737,151), which is a continuation-in-part of Ser. No. 12/799,168, filed Apr. 19, 2010 (U.S. Pat. No. 8,031,545), which is a continuation of Ser. No. 11/881,500, filed Jul. 26, 2007 (U.S. Pat. No. 7,701,791), each of which is hereby incorporated herein by reference in its entirety.

TECHNICAL FIELD OF THE INVENTION

The present invention relates generally to sensing a signal in a memory array. More specifically, the present invention relates to sensing a signal in a two-terminal memory array.

BACKGROUND OF THE INVENTION

Data storage in high-density memory devices can be accomplished using a variety of techniques. Often, the technique used depends on whether or not the stored data is volatile or non-volatile. In volatile memory devices, such as SRAM and DRAM, for example, stored data is not retained when power is removed from the memory device. On the other hand, for non-volatile memory devices, such as MRAM and Flash devices, stored data is retained when power is removed from the memory device.

Resistive state memory devices are a promising new type of non-volatile memory in which data is stored in a memory element as a plurality of resistive states. A first resistive state can represent a logic "1" and a second resistive state can represent a logic "0". The first and second resistive states can be set by applying a write voltage of a predetermined magnitude, polarity, and duration across the memory element during a write operation. For example, voltage pulses can be used to write a logic "1" and a logic "0", respectively.

In either case, after data has been written to the memory element, reading the value of the stored data in the memory element is typically accomplished by applying a read voltage across the memory element and sensing a read current that flows through the memory element. For example, if a logic "0" represents a high resistance and a logic "1" represents a low resistance, then for a constant read voltage, a magnitude of the read current can be indicative of the resistive state of the memory element. Therefore, based on Ohm's law, the read current will be low if the data stored is a logic "0" (e.g., high resistance) or the read current will be high if the data stored is a logic "1" (e.g., low resistance). Consequently, the value of the stored data can be determined by sensing the magnitude of the read current.

In high density memory devices, it is desirable to pack many memory cells in a small area in order to increase memory density and data storage capacity. One factor that can have a significant impact on memory density is the number of terminals that are required to access a memory element for reading or writing. As the number of terminals required to access the memory element increases, device area increases with a concomitant decrease in areal density. Most memory technologies, such as DRAM, SRAM, and some MRAM devices, require at least three terminals to access the core memory element that stores the data. However, in some memory technologies, such as certain resistance based memories, two terminals can be used to both read and write the memory element.

An array of two terminal memory elements can include a plurality of row conductors and a plurality of column conductors and each memory element can have a terminal connected with one of row conductors and the other terminal connected with one of the column conductors. The typical arrangement is a two terminal cross-point memory array where each memory element is positioned approximately at an intersection of one of the row conductors with one of the column conductors. The terminals of the memory element connect with the row and column conductors above and below it. A single memory element can be written by applying the write voltage across the row and column conductors the memory element is connected with. Similarly, the memory element can be read by applying the read voltage across the row and column conductors the memory element is connected with. The read current can be sensed (e.g., measured) flowing through the row conductor or the column conductor.

One challenge that arises from a two-terminal configuration is that memory elements that share a row or column conductor with the memory element being read will also have a potential difference across their respective row and column conductors. The adjacent memory elements can be referred to as half-selected memory elements. The potential difference across the terminals of half-selected memory elements can cause half-select currents to flow through those memory elements. The half-select currents are additive and can be considered as a leakage current that occurs during a read operation. In a high density memory device, the number of memory elements in an array can be several thousand or more. During a read operation to a selected memory element in the array, the half-select currents from half-selected memory elements in the same row or same column as the selected memory element can vastly exceed the magnitude of the read current flowing through the selected memory element. The read current can be considered to be a signal and a magnitude of that signal is indicative of a data value of the data stored in the selected memory element. On the other hand, the leakage current can be considered to be noise that masks the read current signal. Therefore, in a large array, a signal-to-noise ratio (S/N) of the read current to the leakage current is low. A low S/N ratio can make it difficult to distinguish between the read current and the leakage current. Consequently, the low S/N ratio makes it difficult to detect an accurate value for the stored data.

There are continuing efforts to improve accuracy in reading data and in increasing S/N ratios in memory arrays having leakage current.

BRIEF DESCRIPTION OF THE DRAWINGS

FIG. 3A is a block diagram of an exemplary cross point array configuration that includes memory elements electrically coupled with a sense amplifier in the peripheral circuitry;

FIG. 3B depicts an exemplary memory array reduced to a simple RC (resistor/capacitor) network;

FIG. 3C depicts a voltage-time graph of the response of the RC network depicted in FIG. 3B;

Although the previous drawings depict various examples of the invention, the invention is not limited by the depicted examples. The depictions are not necessarily to scale. Like elements are identified with like reference numerals.

DETAILED DESCRIPTION

In the following detailed description, numerous specific details are set forth to provide a thorough understanding of the present invention. It will be apparent to one skilled in the art that the present invention may be practiced without some or all of these specific details. In other instances, well known elements and process steps have not been described in depth in order to avoid unnecessarily obscuring the present invention.

Figure 1A:
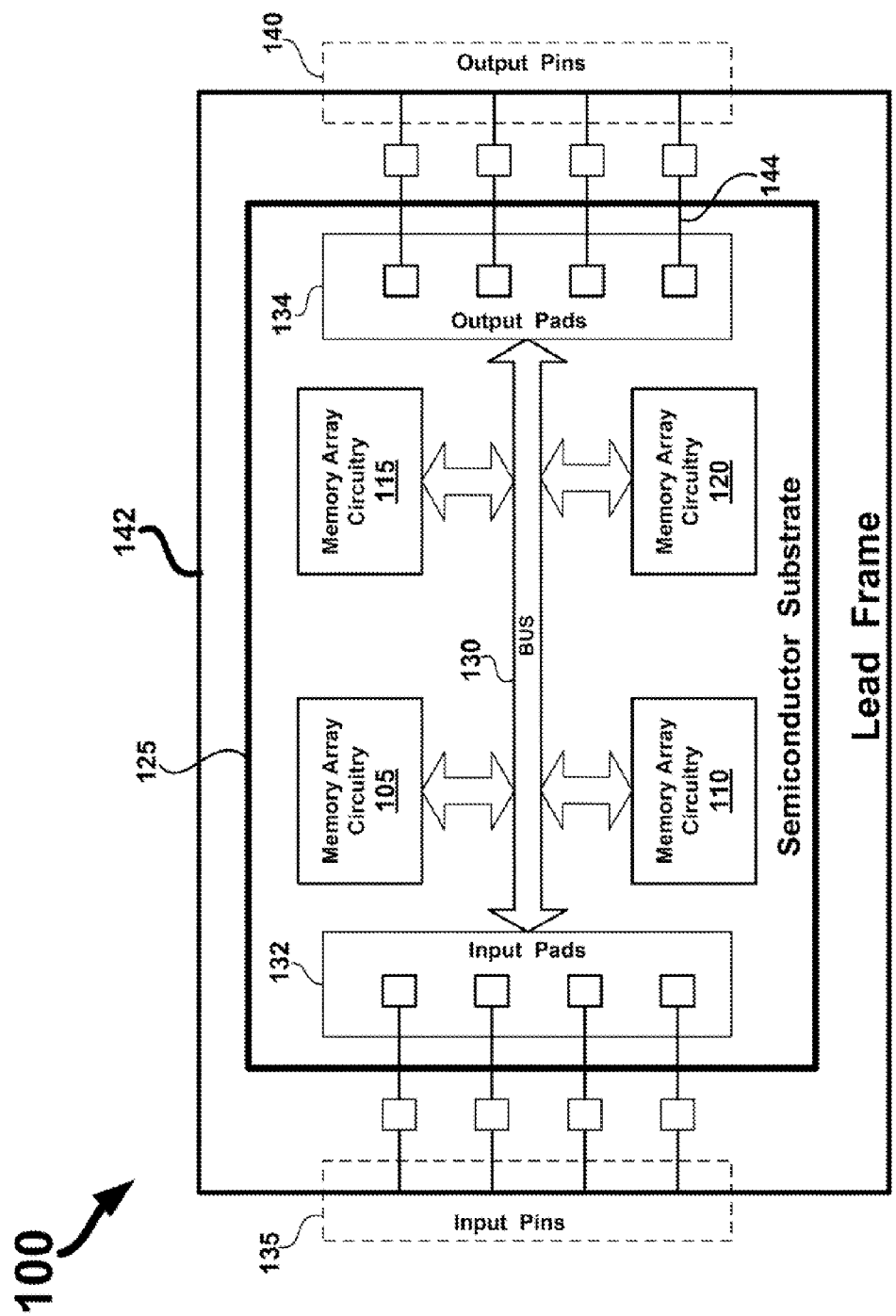
FIG. 1A is a block diagram of an integrated circuit 100 that performs memory functions.

FIG. 1A is a block diagram of an integrated circuit 100 that performs memory functions. Memory array circuitry 105, 110, 115, and 120, which are typically fabricated on a semiconductor substrate 125, are components of the integrated circuit 100. Memory array circuitry 105-120 includes arrays of memory cells and associated peripheral circuitry. A bus 130 connects the memory array circuitry 105-120 to input pads 132 and output pads 134. Input pads 132 and output pads 134 are connected to input pins 135 and output pins 140 through interconnects 144, such as wire bonding. Input and output pins 135 and 140 are typically part of a lead frame 142 that enables the semiconductor substrate 125 to adhere to a form factor requirement of a system.

An input signal from a system that wants to access the memory on the integrated circuit 100 enters the lead frame 142 through input pins 135, where the signal is electrically communicated by interconnects 144 to the input pads 132. The bus 130 carries the input signal to the memory array circuitry 105, 110, 115, and 120. The memory array circuitry 105-120 produces an output signal, which is carried by bus 130 to output pads 134. The output signal is then electrically communicated by interconnects 144 to output pins 140.

Figure 1B:
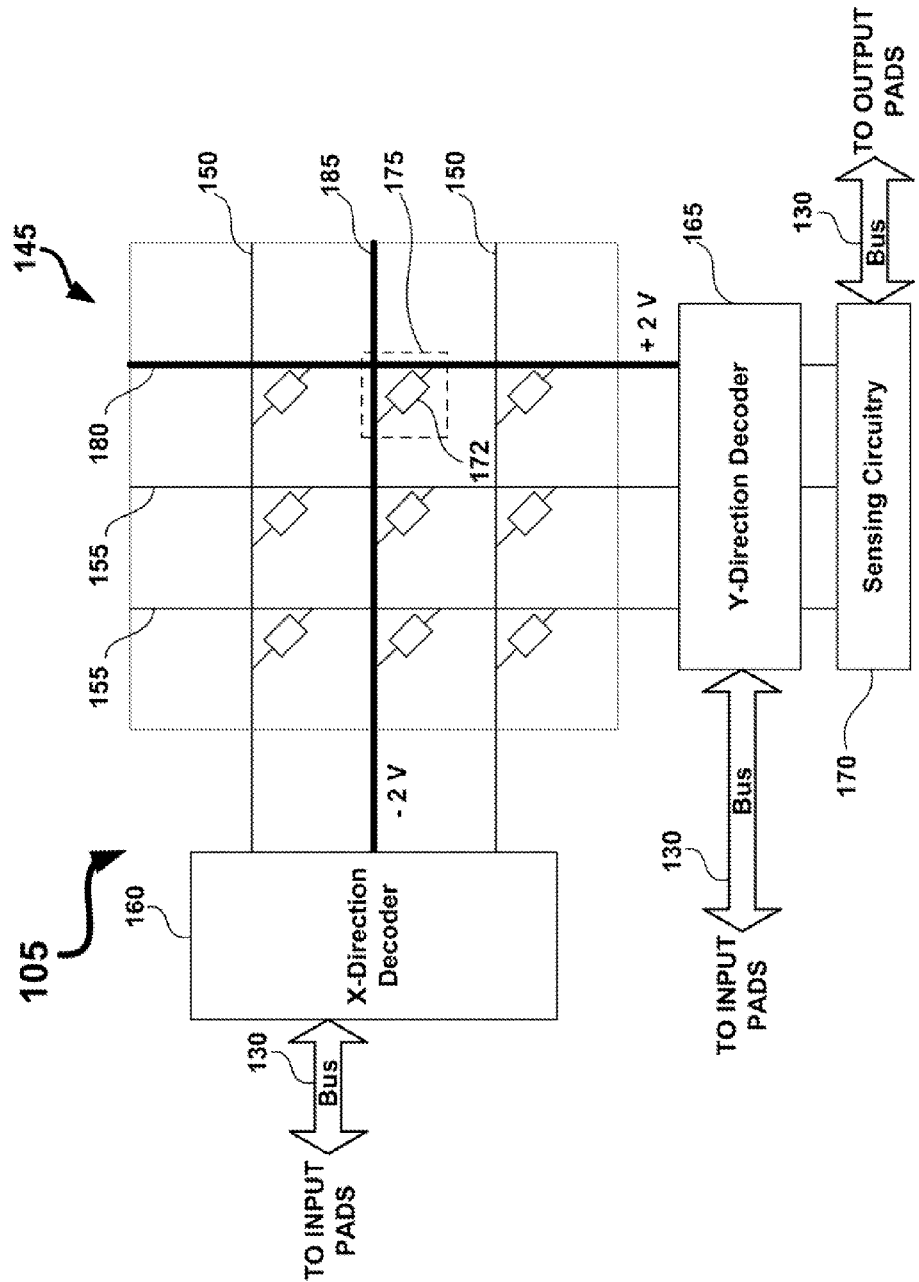
FIG. 1B is a block diagram of the memory array circuitry depicted in FIG. 1A during a single-cell read.

FIG. 1B is a block diagram of the memory array circuitry 105 depicted in FIG. 1A during a single-cell read. The memory array circuitry 105 includes a cross point array 145, which has a number of x-direction array lines 150, a number of y-direction array lines 155, a number of memory cells 175, an x-direction decoder 160, a y-direction decoder 165, and sensing circuitry 170. In a typical cross point array 145, the x-direction array lines 150 and the y-direction array lines 155 are preferably oriented substantially perpendicular to each other. Moreover, the x-direction array lines 150 can be positioned above or below the y-direction array lines 155. The array lines need neither be equal in number nor be proportional in lengths to that of the present depiction.

The cross point array 145 includes a number of memory cells 175, each containing a memory element 172. In a typical cross point array, each memory element 172 is positioned at an intersection of a single x-direction array line 150 with a single y-direction array line 155 and is electrically coupled with its respective array lines. Each memory element 172 is selected for a data operation (e.g., a read or write access) by applying a signal to its respective array lines. The cross point array 145 is a type of memory array that is generally suitable for memory cells 175 that can be accessed with only two terminals. Memory arrays that require more than two terminals require more area for the routing of additional array lines and typically have different layout requirements that cannot be met with cross point arrays. Cross point array 145 can be a single layer of memory cells or a stacked cross point array that includes multiple layers of memory cells that are stacked upon each other. For example, the multiple layers can be vertically stacked along a z-axis. Memory cells in a stacked cross point array can either be electrically isolated from its vertically adjacent layers or can share array lines.

The x-direction decoder 160 and the y-direction decoder 165 transform control signals into signals usable by the cross point array 145. The sensing circuitry 170, usually designed to perform signal amplification, is electrically coupled with the y-direction array lines 155 and is operative to output signals to the bus 130.

Input signal(s) entering the memory array circuitry 105 typically first go through the x-direction decoder 160 and the y-direction decoder 165 via bus 130. The decoded signal(s) then enter cross point array 145, where the signal(s) access appropriate memory cell(s) 175 through the x-direction array line(s) 150 and the y-direction array line(s) 155. Sensing circuitry 170 detects at least one signal and generates an output signal to the output pads 134 via bus 130.

In FIG. 1B, a single memory cell 175 is selected using a selected x-direction array line 185 and a selected y-direction array line 180 (both depicted in heavy line). The selected memory cell 175 includes a selected memory element 172. In the depicted embodiment, the x-direction array line 185 is energized to approximately −2 V by a voltage source and the y-direction array line 180 is energized to approximately +2 V by another voltage source. A current flows through the selected memory element 172. The sensing circuitry 170 detects the current, performs the appropriate amplification of the current, and generates the output signal that is indicative of a binary value of "0" or "1". Although not shown, a page mode access can be accomplished by energizing all y-direction array lines 155 at approximately +2 V and simultaneously sensing the signals on each y-direction array line 155. The actual magnitudes of the voltages used on the selected x-direction 185 and y-direction 180 array lines will depend upon the specifications of cross point array 145 and memory element 172. Similarly, different architecture will use different or alternating polarities.

Figure 2:
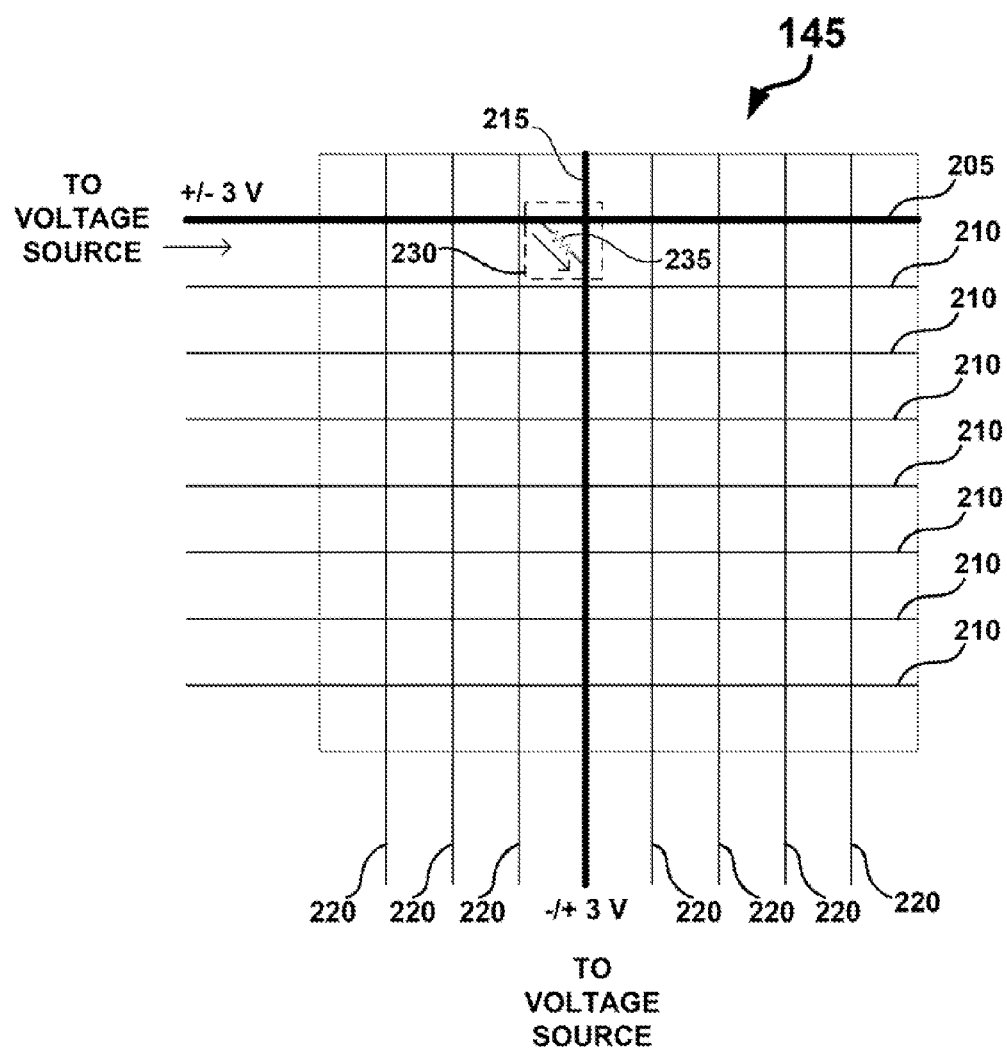
FIG. 2 is a block diagram of a cross point array during a single-cell write.

FIG. 2 is a block diagram of a cross point array 145 during a single-cell write. Each selected memory cell 230 includes a selected memory element 235, which is located at the intersection of a selected x-direction array line 205 and a selected y-direction array line 215. The remaining x-direction array lines 210 and the remaining y-direction array lines 220 are unselected. For example, the array lines 210 and 220 can be electrically coupled to a ground potential. Ground is defined as any baseline reference voltage and is commonly 0V. For clarity, FIG. 2 does not show unselected memory elements located at the intersections of the unselected x-direction array lines 210 and the unselected y-direction array lines 220.

In the depicted embodiment, a +3 V (or −3V) voltage source energizes the selected x-direction array line 205 and a −3 V (or +3V) voltage source energizes the selected y-direction array line 215. Consequently, the memory cell 230 is a selected memory cell (and the memory element 235 is a selected memory element). A voltage source coupled with the selected x-direction array line 205 can apply a voltage potential of +3V (or −3V) and the voltage source coupled with the selected y-direction array line 215 can apply a voltage potential of −3V (or +3V). The resulting potential difference across the selected memory element 235 can be, depending upon the specifications of the memory element, sufficient to trigger the memory element 235 to switch states, thereby performing a write operation. It should be noted that a leakage current can flow through unselected memory elements.

Additionally, the data value written to the selected memory element 235 can depend on the magnitude and polarity of the voltages applied to the array lines 205 and 215. Using the example above, if the voltage applied to the selected x-direction array line 205 is +3 V and the voltage applied to the selected y-direction array line 215 is −3 V, then, for some memory elements, a binary "1" would be written to the selected memory element 235. On the other hand, if the voltage applied to the selected x-directional array line 205 is −3 V and the voltage applied to the selected y-directional array line 215 is +3 V, then a binary "0" would be written to the selected memory element 235. Memory elements using different materials, having different properties and/or being arranged differently could require higher or lower voltages and/or opposite polarities. For some embodiments, modifying magnitude and duration of the applied voltage will also produce intermediate values such as a binary value of "00," "01," "10" or "11. The process, although not shown, can be designed to simultaneously write to multiple memory elements. One method, the "two-cycle write," writes all the "1"s in one cycle and all the "0"s in another cycle.

Further description of one possible memory element can be found in U.S. patent application Ser. No. 11/095,026, filed Mar. 30, 2005, and titled "Memory Using Mixed Valence Conductive Oxides," Published U.S. Application No. 2006/0171200, hereby incorporated by reference in its entirety and for all purposes. The application describes non-volatile third dimension memory cells that can be arranged in a cross-point array. The application explains that a two terminal memory element can change conductivity when exposed to an appropriate voltage drop across the two terminals. The memory element includes both a mixed ionic electronic conductor and a layer of material that has the bulk properties of an electrolytic tunnel barrier (properties of an electronic insulator and an ionic conductor). A voltage drop across the electrolytic tunnel barrier causes an electrical field within the mixed ionic electronic conductor that is strong enough to move oxygen ions out of the mixed ionic electronic conductor and into the electrolytic tunnel barrier. Movement of oxygen causes the memory element to change its conductivity. Referring back to FIG. 5A, the electrolytic tunnel barrier 505 will typically be between 10 and less than 50 angstroms. If the electrolytic tunnel barrier 505 is much greater than 50 angstroms, then the voltage that is required to create the electric field necessary to move electrons through the memory element 500 via tunneling becomes too high for most electronic devices. Depending on the electrolytic tunnel barrier 505 material, a preferred electrolytic tunnel barrier 505 width might be between 15 and 40 angstroms for circuits where rapid access times (on the order of tens of nanoseconds, typically below 100 ns) in small dimension devices (on the order of hundreds of nanometers) are desired. Fundamentally, the electrolytic tunnel barrier 505 is an electronic insulator and an ionic electrolyte. As used herein, an electrolyte is any medium that provides an ion transport mechanism between positive and negative electrodes. Materials suitable for some embodiments include various metal oxides such as $Al_2O_3$, $Ta_2O_5$, $HfO_2$ and $ZrO_2$. Some oxides, such as zirconia might be partially or fully stabilized with other oxides, such as CaO, MgO, or $Y_2O_3$, or doped with materials such as scandium. With standard designs, the electric field at the tunnel barrier 505 is typically high enough to promote tunneling at thicknesses between 10 and 50 angstroms. The electric field is typically higher than at other points in the memory element 500 because of the relatively high serial electronic resistance of the electrolytic tunnel barrier 505. The high electric field of the electrolytic tunnel barrier 505 also penetrates into the ion reservoir 510 at least one Debye length. The Debye length can be defined as the distance which a local electric field affects distribution of free charge carriers. At an appropriate polarity, the electric field within the ion reservoir 510 causes ions (which can be positively or negatively charged) to move from the ion reservoir 510 through the electrolytic tunnel barrier 505, which is an ionic electrolyte. The ion reservoir 510 is a material that is conductive enough to allow current to flow and has mobile ions. The ion reservoir 510 can be, for example, an oxygen reservoir with mobile oxygen ions. Oxygen ions are negative in charge, and will flow in the direction opposite of current.

Other resistive state memory devices can be used to implement the memory elements and the present invention is not limited to the above described oxygen ion transport memory element. Other resistive random access memory (RRAM) devices that are configured to change resistive states in response to write data operations, whether by application of write voltages or write currents, can be used to implement the memory elements. Write signals (e.g., write voltages or write currents) may be applied as pulses (e.g., uni-polar or bi-polar). Example RRAM technologies include phase change memory (PCM) devices, conductive bridge (CBRAM) memory devices, MEMRISTOR memory devices, memristive memory devices, filamentary RRAM devices, memory devices that utilize mobile metal ion transport and/or motion to change resistive states, non-MRAM memory devices that utilize at least one tunnel oxide layer or at least one tunnel barrier layer (e.g., at least one tunneling layer) in conjunction with at least one other layer of material (e.g., an ion reservoir) that is in contact with or is electrically in series with the tunneling layer, just to name a few. The memory elements can be single level cells (SLC) that store only one-bit of data or can be multi-level cells (MLC) that store at least two-bits of data.

FIG. 3A is a block diagram of an exemplary cross point array configuration that includes memory elements electrically coupled with a sense amplifier 350 in the peripheral circuitry. In this depiction, a cross point array 300 has one selected x-direction array line 305 (depicted in heavy line), 1023 unselected x-direction array lines 310, a y-direction array line 320 (depicted in heavy line) that is held at approximately 0 V, and memory cells 330. Each memory cell 330 includes a memory element 335, which is placed at the intersections of one of the x-direction array lines (305, 310) and the y-direction array line 320. Although not depicted, the array 300 may include additional y-direction array lines which might or might not be sensed simultaneously.

A reference voltage $V_{REF}$ is electrically coupled with one of the inputs of the sense amplifier 350 and the voltage applied to the y-direction array line 320 is electrically coupled with another input of the sense amplifier 350. The memory element 330 may include a non-ohmic device, as described in "High Density NVRAM," U.S. application Ser. No. 10/360,005, filed Feb. 7, 2003, now U.S. Pat. No. 6,917,539, incorporated herein by reference in its entirety and for all purposes. The non-ohmic device exhibits a very high resistance for a certain range of voltages and a very low resistance for voltages outside that range. A variable resistance of the memory element 335 on the selected x-direction array line 305 is denoted as R. Current will flow from the selected x-direction array line 305 to the y-direction array line 320, which is initially charged to the unselected word line potential ("precharged"), which is about 0 V. In a preferred embodiment, the y-direction array line 320 floats from ground to a voltage much less than the read voltage on the selected x-direction array line 305 (depicted as 1 V in FIG. 3A), but greater than 0 V. In such an embodiment, a small amount of current will flow from the y-direction array line 320 to the unselected x-direction array lines 310.

FIG. 3B depicts an exemplary memory array 300 reduced to a simple RC (resistor/capacitor) network. In order for the sense amplifier 350 to produce a useful output with an acceptable access time, prior art techniques would require a difference of at least 50 mV between a reference voltage ($V_{REF}$) and the y-direction array line 320 voltage ($V_{BIT\ LINE}$). Assuming R for a "1" is about 100 kΩ and R for a "0" is about 1 MΩ, then the unselected memory elements can be represented as a capacitor (for the intrinsic capacitance) and a single resistor having the value of R/1023 (since there are 1023 unselected lines in FIG. 3A). The combined value of R/1023 will have a maximum value when all of the unselected lines are "0" and a minimum value when all of the unselected lines are "1". Y-direction array line 320 will have an associated capacitance, which can have an exemplary value of 1 pF. If the exemplary resistance is 100 kΩ for a "1" state, the initial current charging the associated capacitance is 10 μA (1 V/100 kΩ). If the exemplary resistance is assumed to be 1 MΩ for a "0" state, the initial current charging the associated capacitance is 1 μA (1 V/1 MΩ). The rate of change of y-direction array line 320 voltage is determined by current divided by capacitance (I/C). To reach 100 mV the time required for a memory cell in the "1" state would be 10 μs, which can be derived from [(100 mV)×(1 pf)/10 μA]. Since the rate of change of y-direction array line 320 voltage is higher with higher current, rate of change can be used to determine the memory cell's state. This is depicted in FIG. 3C, which is a voltage-time graph of the response of the RC network depicted in FIG. 3B.

Figure 4:
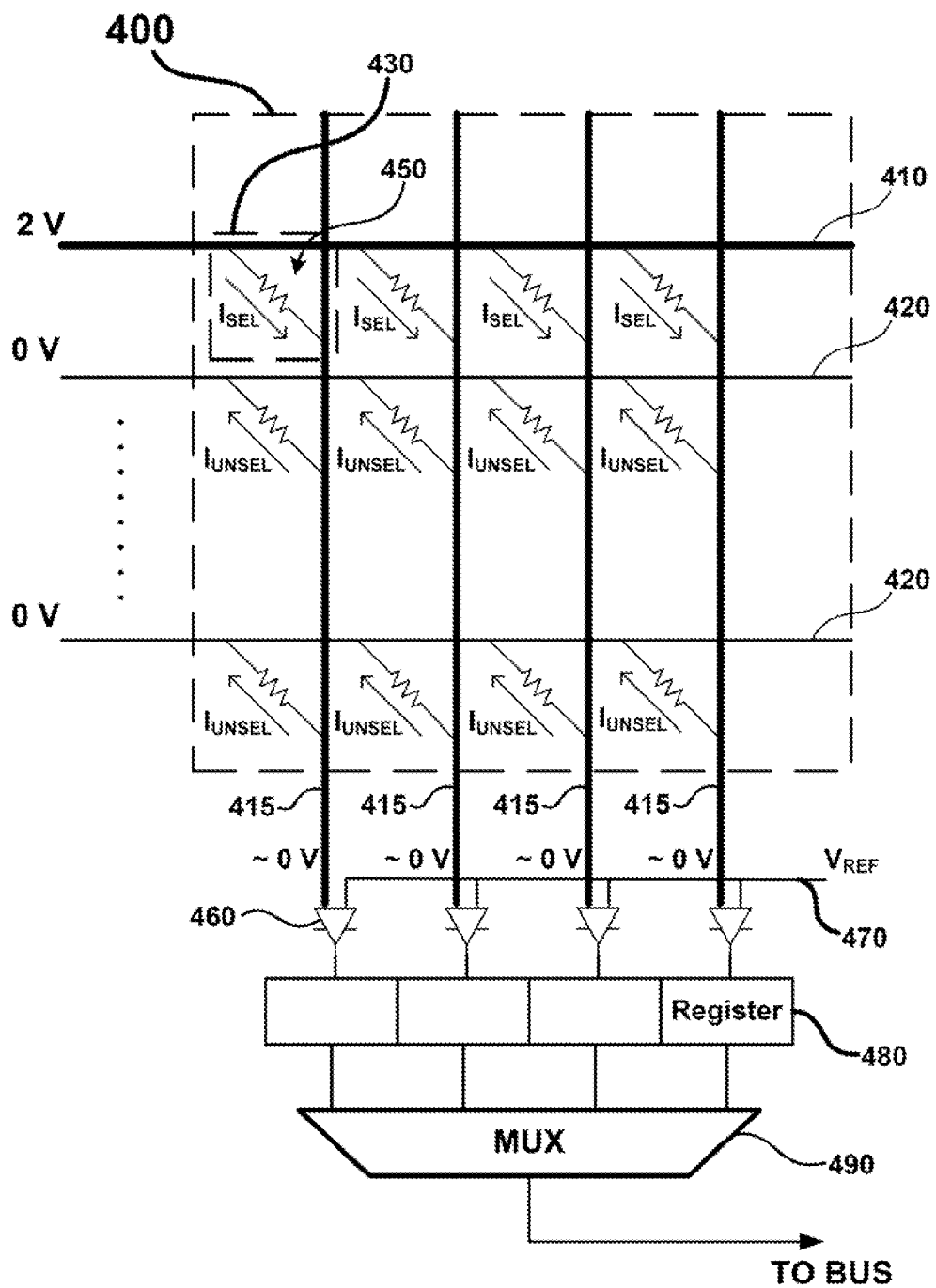
FIG. 4 is a block diagram depicting an exemplary high-latency cross point array.

FIG. 4 is a block diagram depicting an exemplary high-latency cross point array 400. The cross point array 400 includes a selected x-direction array line 410 (depicted in heavy line), a number of unselected x-direction array lines 420, a number of y-direction array lines 415 (depicted in heavy line), and a number of memory cells 430. Each memory cell 430 includes a memory element 450, which is positioned at the intersection of one of the x-direction array lines (410, 420) and one of the y-direction array lines 415.

In this depiction, the selected x-direction array line 410 is energized by a voltage source at 2 V while the unselected x-direction array lines 420 are grounded at approximately 0 V. The magnitude and polarity of the voltage potentials applied to the array lines (410, 415, and 420) will be application and material dependent. The y-direction array lines 415 are precharged to the same voltage as the unselected x-direction array lines 420 (approximately 0 V). A current $I_{SEL}$ flows through each selected memory element 450 that is positioned at the intersection of the selected x-direction array line 410 and the y-direction array lines 415. As the y-direction array lines 415 are charged by the selected x-direction array line 410, another current $I_{UNSEL}$ flows through the unselected memory elements 450 positioned at the intersection of one of the unselected x-direction array lines 420 and one of the y-direction array lines 415. In the configuration depicted, $I_{SEL}$ is typically much higher than $I_{UNSEL}$. In a preferred embodiment, all the $I_{UNSEL}$ together ($\Sigma\square I_{UNSEL}$) flowing from a single y-direction array line 415 is less than $I_{SEL}$ from that y-direction array line 415. Since R (see FIG. 3A) can be representative of a "0" or a "1", $I_{SEL}$ flowing through each memory element 450 along the selected x-direction array line 410 need not be equal in magnitude. Likewise, $I_{UNSEL}$ flowing through each memory element 450 along the unselected x-direction array lines 420 need not be equal in magnitude.

Multiple y-direction array lines 415 can be read simultaneously to attain a faster read rate. In such a multi-sensing read, the total current on the selected x-direction line 410 is the sum of the currents on all of the memory elements 450 located along the selected x-direction line 410. Generally, current density of array lines increases with narrower width of array lines. However, technological issues such as electromigration can become a significant hindrance to the reliability of the integrated circuit if current density exceeds a desirable limit. Because narrow width of array lines is advantageous in increasing the areal density of the array 400, it is preferable to read the memory elements 450 at a low total current in order to keep current density low. Furthermore, arrays with lower currents have lower power consumption and lower heat dissipation.

Figure 5:
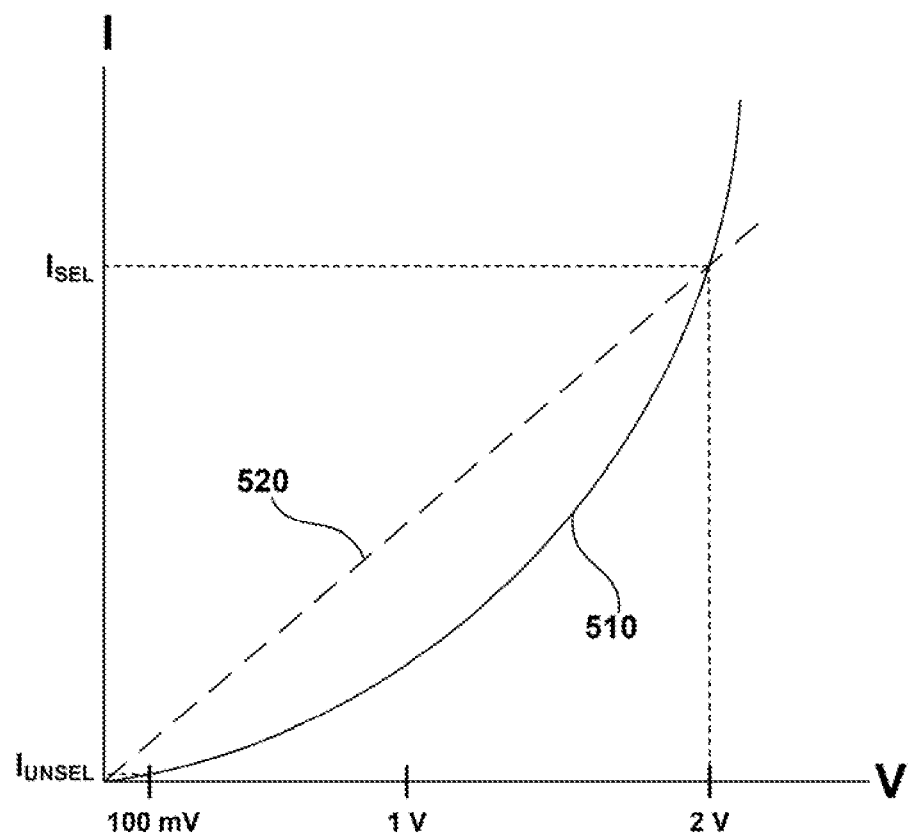
FIG. 5 depicts an current-voltage (I-V) graph of an exemplary memory element, with which may be used to populate the cross point array.
Figure 5A:
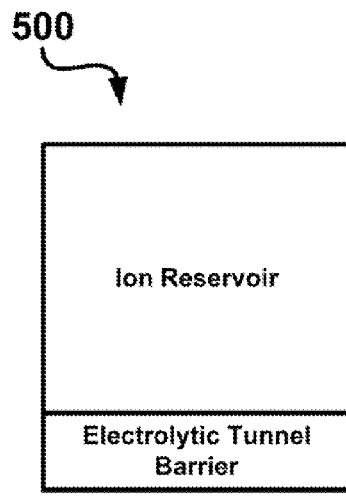
FIG. 5A depicts a block diagram representing the basic components of one embodiment of a memory element.
Figure 5B:
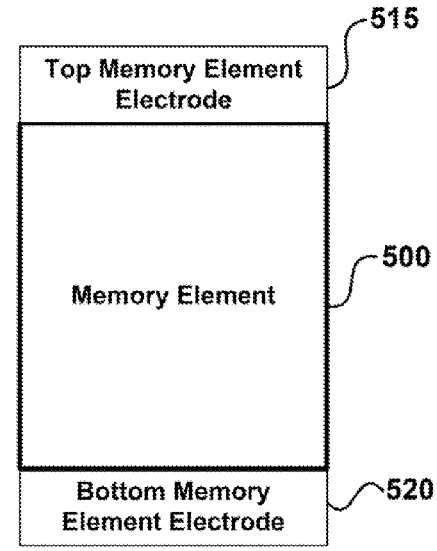
FIG. 5B depicts a block diagram of the memory element of FIG. 5A in a two-terminal memory cell.
Figure 5C:
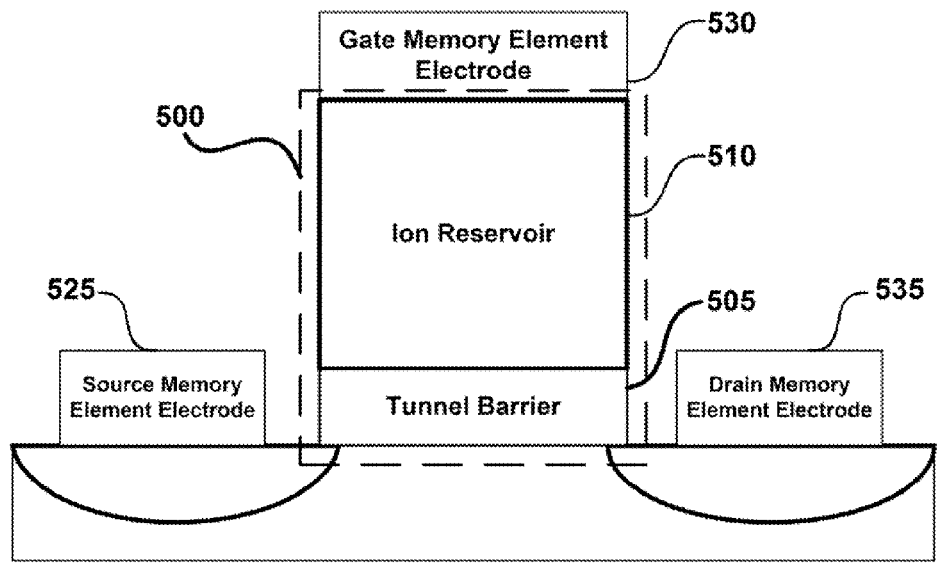
FIG. 5C depicts a block diagram of the memory element of FIG. 5A in a three-terminal memory cell.

FIG. 5 depicts a current-voltage (I-V) graph of an exemplary memory element 450, with which may be used to populate the cross point array 400. As can be seen on the graph, the memory element 450 produces a non-linear I-V curve 510 whereas an ideally resistive device produces a linear I-V curve 520. Accordingly, the resistance of memory element 450 is a non-linear function of the voltage applied across the memory element 450. It is possible to achieve a much lower current at low voltage inputs by using a memory element 450 that has a non-linear resistance as a function of applied voltage rather than by using a linear resistive element.

As shown in FIG. 4, a voltage of 2 V generates a current $I_{SEL}$ through the memory elements on the selected x-direction array line 410, and the 100 mV applied to the y-direction array lines 415 generates a current $I_{UNSEL}$ through memory elements 450 on the unselected x-direction array lines 420. The ratio of $I_{SEL}$ to $I_{UNSEL}$ can reach approximately 1,000,000 for the configuration depicted in FIG. 4. It is generally desirable to obtain as high a ratio as possible for $I_{SEL}$ to $I_{UNSEL}$. Because of the nonlinear nature of the memory element, an $I_{SEL}$ to $I_{UNSEL}$ ratio can be substantially higher than an $I_{SEL}$ to $I_{HALF-SEL}$ ratio.

Figure 6A:
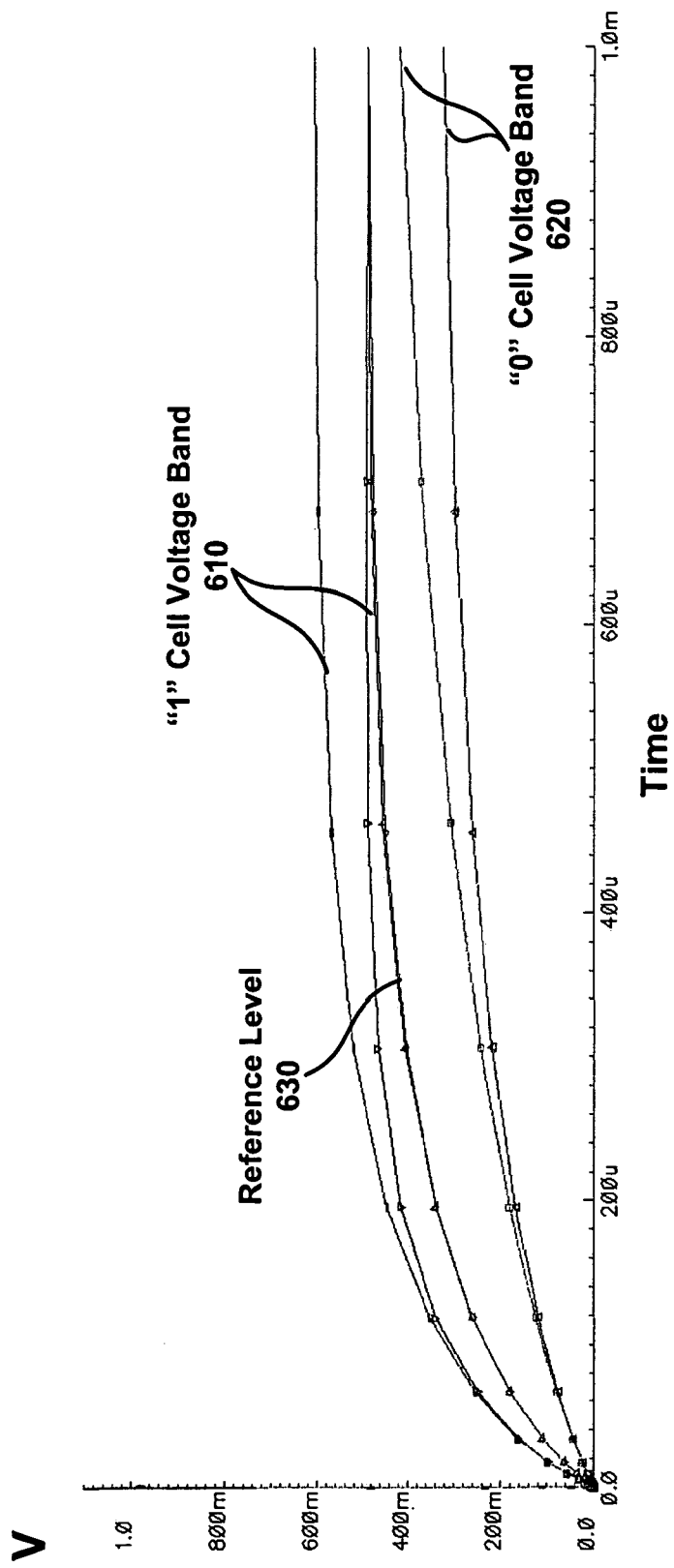
FIG. 6A depicts a voltage-time graph of an exemplary reference voltage in relation to an exemplary "1" cell voltage band and an exemplary "0" cell voltage band.

FIG. 6A depicts a voltage-time graph of an exemplary reference voltage ($V_{REF}$) 630 in relation to an exemplary "1" cell voltage band 610 and an exemplary "0" cell voltage band 620. The voltage detected by each sense amplifier 460 (see FIG. 4) is a result of all the voltage drops along its y-direction array line 415. If the memory cell 430 is in the "1" state, then the sense amplifier 460 could receive a voltage anywhere within the "1" cell voltage band 610. Precisely where the voltage will fall within the band will depend on the individual states of the unselected memory cells. Similarly, if the memory cell 430 is in the "0" state, then the sense amplifier could receive a voltage anywhere within the "0" cell voltage band 620, depending on the states of the unselected memory cells. The shape of each band will, of course, depend on the specific features of the memory cells that are used. The depicted reference voltage 630 assumes a column of reference cells programmed to a mid-point between a "0" state and a "1" state, as described in "Two Terminal Memory Array Having Reference Cells," U.S. application Ser. No. 10/895,218, filed Jul. 11, 2006, now U.S. Pat. No. 7,075,817, incorporated herein by reference in its entirety and for all purposes.

In other embodiments, a reference cell can be programmed to a point that is anywhere between a "0" state and a "1" state, that is, at some point that is not a mid-point. Therefore, reference cell can be programmed to a point that is greater than the lowest resistance value and less than the highest resistance value. For example, the resistive state of the reference cell can be a weighted average of the "0" state and a "1" state, a percentage of the "0" state, or a percentage of the "1" state. Assuming R for a "1" (e.g., an erased state) is about 100 k$\Omega$ and R for a "0" (e.g., a programmed state) is about 1 M$\Omega$, then a mid-point could be approximately 550 k$\Omega$. As one example, a percentage of the "0" state can be approximately 80% of the resistance for the "0" state (e.g., 1M$\Omega$×0.8). As another example, a percentage of the "1" state can be approximately 40% of the resistance for the "1" state or 100 k$\Omega$×0.4.

Figure 6B:
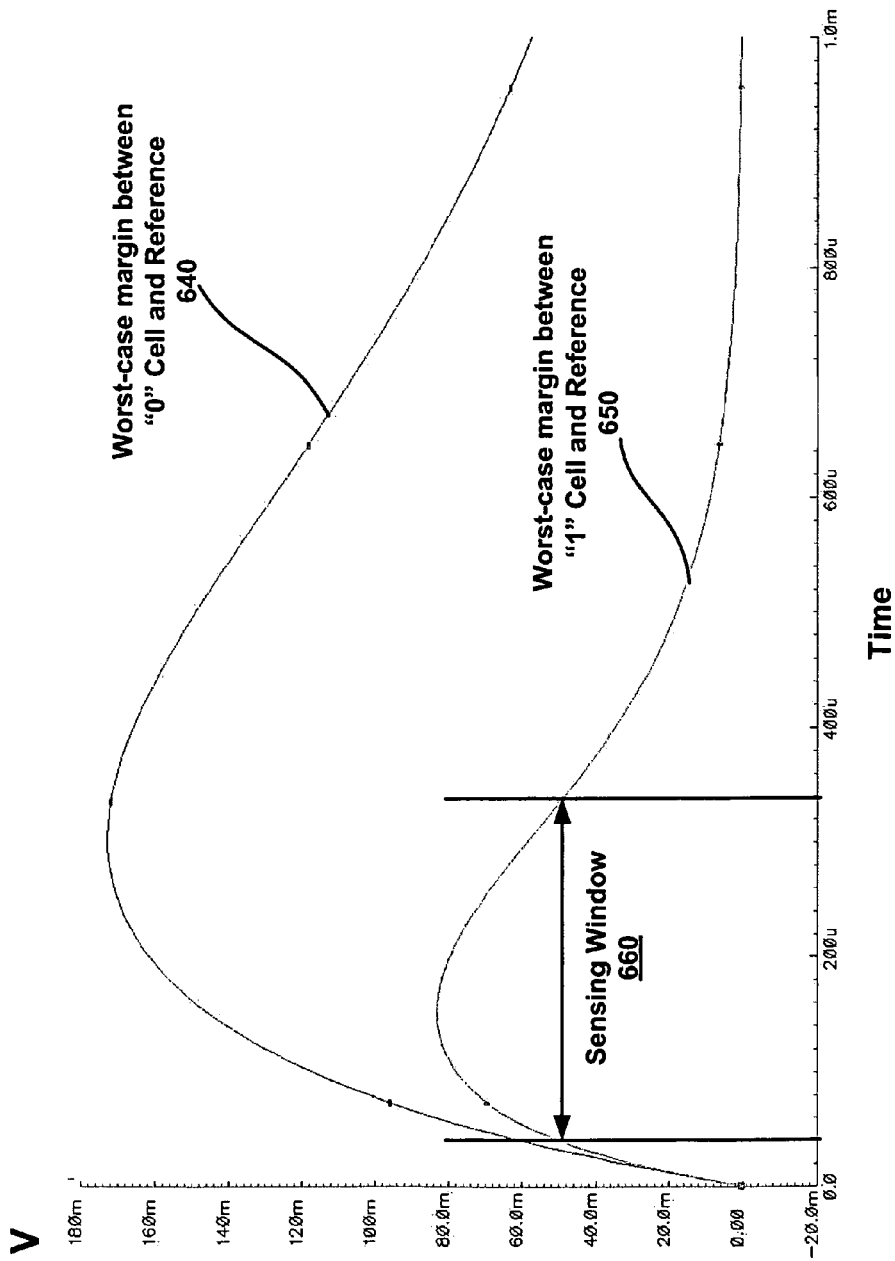
FIG. 6B depicts a voltage-time graph of the margin between the exemplary reference voltage and the worst-case scenarios of the "1" cell voltage band and the "0" cell voltage band.

FIG. 6B depicts a voltage-time graph of the margin between the exemplary reference voltage 630 and the worst-case scenarios of the "1" cell voltage band 610 and the "0" cell voltage band 620. The worst-case margin between "0" cell and reference voltage 640 is the profile derived from a selected cell in the "0" state and 1023 unselected cells in the "1" state subtracted from a column of 1024 cells in a "reference" state (550 k$\Omega$). Similarly, the worst-case margin between "1" cell and reference voltage 650 is the profile derived from a selected cell in the "1" state and 1023 unselected cells in the "0" state subtracted from a column of 1024 cells in the "reference" state. If the sense amplifiers 460 (see FIG. 4) require a minimum voltage differential of 50 mV, then a comfortable sensing window 660 would be between 40 µs and 340 µs, limited by the "1" cell margin 650. If desired, those skilled in the art can optimize the reference voltage 470 such that a different sensing window 660 is derived. A sensing window (the time period where a minimum voltage differential between a memory state and a reference level is assured) depends upon design choices that include the type of memory cell that is being used, the type of sense amp being used, what reference level is used, etc.

Referring back to FIG. 4, the selected x-direction array line 410 (which can be considered a word line) is energized to an appropriate x-direction read voltage, the unselected x-direction array lines 420 are brought to ground and the y-direction array lines 415 (which can be considered a bit line), initially at ground, is allowed to float for some time within a sensing window. The sense amplifiers 460 then output a signal to a register 480. Depending on width of the bus, a multiplexer 490 may then be used to ensure the output has the correct size. For example, if the output width is 8 bits, and if there are 1024 y-direction array lines 415, then the multiplexer 490 would output 128 bytes from the register 480. It should be appreciated that while the latency of the system would be relatively high due to the sensing window, once the register 480 was full, the throughput from the register to the bus would be very fast, limited only by the width of the bus and the cycle speed.

Although the invention has been described in its presently contemplated best mode, it is clear that it is susceptible to numerous modifications, modes of operation and embodiments, all within the ability and skill of those familiar with the art and without exercise of further inventive activity. Accordingly, that which is intended to be protected by Letters Patent is set forth in the claims and includes all variations and modifications that fall within the spirit and scope of the claim.

What is claimed is:

1. An integrated circuit, comprising:
a plurality of bit lines;
a plurality of word lines;
a plurality of re-writeable non-volatile resistive state memory elements, each memory element positioned at an intersection of one word line of the plurality of word lines with one bit line of the plurality of bit lines, and each memory element has a resistance that is a non-linear function of a voltage applied across the respective memory element;
word line circuitry to apply a first voltage to a first word line of the plurality of word lines and to apply a second voltage to a remainder of the plurality of word lines, wherein the first word line, having the first voltage applied to it, is a selected word line and the remainder of the plurality of word lines, having the second voltage applied to them, are un-selected word lines;
pre-charge circuitry to apply the second voltage to the plurality of bit lines when the first voltage is applied to the first word line and the second voltage is applied to the remainder of the plurality of word lines;
a reference cell comprising a first terminal electrically coupled with a reference bit line and a second terminal electrically coupled with the selected word line; and
sensing circuitry coupled to the plurality of bit lines and the reference bit line, the sensing circuitry to:
sense a voltage change during a sensing window of a bit line of the plurality of bit lines using a sense amplifier, wherein the sense amplifier is coupled to the reference bit line and the bit line of the plurality of bit lines; and
output read data indicative of a current on the bit line of the plurality of bit lines, responsive to sensing the voltage change of the bit line of the plurality of bit lines, the current being indicative of a resistance state of the memory element positioned at the intersection of the selected word line and the bit line.

2. The integrated circuit of claim 1, wherein the sensing circuitry comprises a plurality of sense amplifiers and the reference cell is electrically coupled to each sense amplifier of the plurality of sense amplifiers.

3. The integrated circuit of claim 2, further comprising a plurality of additional reference cells, each reference cell comprising a first terminal electrically coupled with the reference bit line and a second terminal electrically coupled with one of the plurality of word lines, wherein the reference bit line is coupled to each sense amplifier of the plurality of sense amplifiers.

4. The integrated circuit of claim 1, wherein the reference cell is programmed to a resistance value that is a weighted average of a first resistance value indicative of a logic "0" state and a second resistance value indicative of a logic "1" state.

5. The integrated circuit of claim 1, wherein the reference cell is programmed to a resistance value other than a first resistance value indicative of a logic "0" state, a second resistance value indicative of a logic "1" state, or other than a midpoint resistance value that is approximately mid-way between the first resistance value and the second resistance value.

6. The integrated circuit of claim 1, wherein the reference cell has a structure of a memory element programmed to an intermediate resistance.

7. The integrated circuit of claim 1, wherein the plurality of memory elements comprise one of: phase change memory elements, conductive bridge memory elements, filamentary memory elements, memristor memory elements, memristive memory elements, memory elements utilizing mobile metal ion motion to change resistive states, or a tunneling layer that is electrically in series with or is in contact with an ion reservoir.

8. The integrated circuit of claim 1, wherein the reference cell comprises one of a phase change memory element, a conductive bridge memory element, a filamentary memory element, a memristor memory element, a memristive memory element, a memory element utilizing mobile metal ion motion to change resistive states, or a tunneling layer that is electrically in series with or is in contact with an ion reservoir.

9. An integrated circuit, comprising:
a plurality of bit lines;
a plurality of word lines;
a plurality of re-writeable non-volatile resistive state memory elements, each memory element of the plurality of re-writeable non-volatile resistive state memory elements has a resistance that is a non-linear function of a voltage applied across the respective memory element;
a plurality of reference cells, each reference cell comprising a first terminal electrically coupled with a reference bit line and a second terminal electrically coupled with one of the plurality of word lines;
pre-charge circuitry to apply a same voltage to the plurality of bit lines as a voltage applied to a remainder of un-selected word lines of the plurality of word lines when a first word line of the plurality of word lines is selected; and
sensing circuitry coupled to the plurality of bit lines and the reference bit line, the sensing circuitry to sense a voltage change during a sensing window of a bit line of the plurality of bit lines using a sense amplifier, wherein the sense amplifier is coupled to the reference bit line and the bit line of the plurality of bit lines, wherein the voltage change is indicative of a resistance state of the memory element positioned at the intersection of the first word line and the bit line.

10. The integrated circuit of claim 9, wherein the sensing circuitry is further to output read data indicative of a current on the bit line of the plurality of bit lines, responsive to sensing the voltage change of the bit line of the plurality of bit lines, the current being indicative of the resistance state of the memory element.

11. The integrated circuit of claim 9, further comprising word line circuitry to apply a first voltage to the first word line of the plurality of word lines and to apply a second voltage to the remainder of un-selected word lines of the plurality of word lines, wherein the pre-charge circuit is to apply the second voltage to the plurality of bit lines when the first voltage is applied to the first word line and the second voltage is applied to the remainder of un-selected word lines.

12. The integrated circuitry of the claim 9, wherein the sensing circuitry comprises a plurality of sense amplifiers and the plurality of reference cells are electrically coupled to each sense amplifier of the plurality of sense amplifiers.

13. The integrated circuit of claim 9, wherein the plurality of reference cells are programmed to a resistance value that is a weighted average of a first resistance value indicative of a logic "0" state and a second resistance value indicative of a logic "1" state.

14. The integrated circuit of claim 9, wherein the plurality of reference cells are programmed to a resistance value other than a first resistance value indicative of a logic "0" state, a second resistance value indicative of a logic "1" state, or other than a midpoint resistance value that is approximately mid-way between the first resistance value and the second resistance value.

15. The integrated circuit of claim 9, wherein the plurality of reference cells have a structure of a memory element programmed to an intermediate resistance.

16. The integrated circuit of claim 9, wherein the plurality of reference cells: phase change memory elements, conductive bridge memory elements, filamentary memory elements, MEMRISTOR memory elements, memristive memory elements, memory elements utilizing mobile metal ion motion to change resistive states, or a tunneling layer that is electrically in series with or is in contact with an ion reservoir.

17. A method comprising:
applying a first voltage to a reference cell comprising a first terminal electrically coupled with a reference bit line and a second terminal electrically coupled with a selected word line;
applying a second voltage to un-selected word lines;
pre-charging a plurality of bit lines with the second voltage;
sensing, with sensing circuitry, a voltage change during a sensing window of a bit line of a plurality of bit lines using a sense amplifier, wherein the sense amplifier is coupled to the reference bit line and the bit line of the plurality of bit lines; and
outputting read data indicative of a current on the bit line of the plurality of bit lines, responsive to sensing the voltage change of the bit line of the plurality of bit lines, wherein the voltage change is indicative of a resistance state of a resistive state memory element positioned at an intersection of the selected word line and the bit line, wherein the resistive state memory element has a resistance that is a non-linear function of a voltage applied across the resistive state memory element.

18. The method of claim 17, further comprising applying, with word line circuitry, the first voltage to a first word line of a plurality of word lines and to apply the second voltage to a remainder of the plurality of word lines, wherein the first word line, having the first voltage applied to it, is the selected word line and the remainder of the plurality of word lines, having the second voltage applied to them, are un-selected word lines.

19. The method of claim 17, wherein the sensing circuitry comprises a plurality of sense amplifiers and the reference cell is electrically coupled to each sense amplifier of the plurality of sense amplifiers.

20. The method of claim 17, wherein the reference cell is programmed to a resistance value other than a first resistance value indicative of a logic "0" state, a second resistance value indicative of a logic "1" state, or other than a midpoint resistance value that is approximately mid-way between the first resistance value and the second resistance value.

21. The integrated circuit of claim 1, wherein the sensing window is a time period wherein a minimum voltage differential between a first voltage of the bit line of the plurality of bit lines and a second voltage of the reference bit line is assured.

* * * * *